March 8, 1960 D. E. IGLESIAS 2,928,031

CONTACT MEMBER FOR SEMICONDUCTOR TRANSLATING DEVICE

Filed Sept. 4, 1958

INVENTOR
D. E. IGLESIAS
BY Lucian C. Canepa
ATTORNEY

1

2,928,031

CONTACT MEMBER FOR SEMICONDUCTOR TRANSLATING DEVICE

David E. Iglesias, Maplewood, N.J., assignor to Bell Telephone Laboratories, Incorporated, New York, N.Y., a corporation of New York Application September 4, 1958, Serial No. 758,996

4 Claims. (Cl. 317—234)

This invention relates to semiconductor translating devices, and more particularly to an element for providing electrical contact to the small area mesa of a silicon or germanium diffused diode.

Silicon or germanium diffused diodes as presently constructed consist of a base wafer with a projection or mesa on one face thereof, the mesa containing the rectifying junction between the p- and n-type materials of which the diode is composed. The mesa is typically 0.001 inch high with a circular top surface 0.001 inch in diameter. The base wafer is ordinarily of the same shape, being however, about four times as thick as the mesa and having a diameter about thirty times as great.

Providing electrical contact to the mesa of a silicon or germanium diffused diode has presented many problems. Since the mesa is of small size, barely if at all perceptible with the naked eye, positioning an electrical lead or sharp point-contact type of element thereon requires great precision. Two other major considerations also present themselves. First, the contacting element must be resilient enough so as not to strain the mesa or subject it to harmful stress upon physical shock or temperature change. Second, the contacting element must not have an appreciable inductive reactance at the high frequencies at which such diodes customarily find use.

Small diameter wire leads with bends therein to provide flexibility have been utilized in the prior art as contact making elements. While satisfying the requirement of flexibility, these leads have an appreciable inductive reactance at high frequencies. Also, positioning such leads on the mesa is quite difficult. Larger pin type structures have been used, but while these substantially eliminate the inductive effect exhibited by thin wire leads, such structures do not satisfy the aforementioned flexibility requirement.

An object of the present invention is a contacting element for the small area mesa of a semiconductor translating device, which element is characterized by both low inductance and a high degree of resiliency.

Another object of this invention is a contacting element which is capable of easy and noncritical positioning upon the mesa of a diffused silicon or germanium diode.

Yet another object of the present invention is a contacting element capable of easy manufacture.

These and other objects of the present invention are realized in an illustrative embodiment thereof wherein a contacting element is formed from a conductive pin member, one end of which has a hollowed out portion. A metal diaphragm is spot welded to the hollowed out pin end, and is the portion of the contacting element designed to come into direct contact with the mesa of a translating device. During the welding process, the diaphragm assumes a convex outward shape with respect to the pin end. It is this resilient diaphragm that provides the flexibility of the contacting member and which protects against stress and strain produced by mechanical shock and temperature change. At the same time, the utilization of a pin type structure substantially limits the inductance of the contacting element.

2

Both the semiconductor device and the contacting element are mounted in a compact supporting structure. The pin-diaphragm contact element is positioned against the mesa of the device, and after secure electrical contact has been established therewith, the contact element is held permanently in place by the use of set screws.

Since the forming of the diaphragm curvature during the welding step is accomplished simply by the use of a welding rod with a concave tip, the manufacture of these contact elements is quite simple. Furthermore, since the flexible diaphragm is spot welded to a rigid pin member, the entire contacting element is capable of easy handling and storage before assembly, and the danger of deforming the element is substantially reduced.

In positioning the diaphragm upon the mesa, no portion of the curved diaphragm should touch the surrounding wafer surface, or a shorting out of the diode will result. Thus, for a given diaphragm curvature and a given mesa size, there will be a certain area of the diaphragm on which contact with the mesa may be made without shorting out the diode. By choosing the curvature of the diaphragm accordingly, the degree of accuracy required for such a positioning may be substantially reduced and the allowable contacting surface area of the diaphragm may be made many times the area of the mesa that is to be contacted. Thus, the difficulty heretofore encountered in positioning thin wire leads and sharp point-contact types of contacting elements upon the small area mesas of germanium or silicon diffused diodes is substantially eliminated.

Thus, a feature of the present invention is a mesa contacting element comprising a conductive pin member having secured to one end thereof a flexible conductive diaphragm, whereby a contacting structure possessing both low inductance and high resiliency is provided.

The invention may be better understood by consulting the following description of which the accompanying drawing is a part, and in which.

Figure 1:
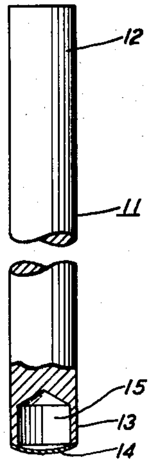
Fig. 1 depicts in partial section a contacting element made in accordance with the principles of the present invention.

Referring to Fig. 1, the contacting element 11 comprises a machined pin 12 composed of nickel or any other material having similar electrical characteristics and capable of being welded. Pin length and diameter are dictated by the inductance and resistivity requirements of the contacting element, and by the size and characteristics of the supporting structure of the diode and its mesa contacting element. It is to be noted that contact element resilience is in no way dependent upon pin length. Therefore, in order to effect the greatest reduction in contact element inductance, pin length should be kept as short as possible. For diodes with wafer and mesa sizes of the order above mentioned, the contacting element in one specific instance was composed of a pin of 0.375 inch in length, with a diameter of 0.050 inch.

Advantageously, one end of the pin 12 is bored, thus leaving a thin cylindrical wall 13. This thin wall serves two purposes. First, a better welding edge is obtained;

second, a greater inside diaphragm area is achieved, thereby permitting better diaphragm action. In the specific instance mentioned above, the bore had a diameter of 0.043 inch and extended 0.031 inch into the pin.

A thin diaphragm 14 is welded or otherwise suitably bonded to the end of pin 12 which contains the bored hole 15. In one specific instance the diaphragm was composed of Nilvar, a nickel alloy composed of 31 percent nickel, 4 percent cobalt, and 65 percent iron. This particular alloy has sufficient hardness to give good spring action as a diaphragm. Squares about one-eighth of an inch on a side were cut in advance of the welding step, but a strip of foil, for example, could be used in an automatic process. The diaphragm thickness is dictated by the resilience requirement of the contacting element. In the specific embodiment of the invention mentioned above, the diaphragm was 0.001 inch thick.

The curvature of the diaphragm 14, which is convex outward with respect to the rod end to which it is attached, is dictated mainly by the size of the mesa and the achievable degree of accuracy in positioning the diaphragm upon the mesa. In positioning the diaphragm upon the mesa, care must be taken so as not to allow the diaphragm to short out the diode by touching the base wafer. Shorting occurs with a diaphragm of a given curvature by not positioning the diaphragm center point directly over the mesa. Therefore, the amount of allowable off-center positioning of the diaphragm is governed by diaphragm curvature for any particular mesa size. Accordingly, the diaphragm curvature should be chosen such that easy and relatively noncritical positioning of the diaphragm on the mesa may be attained. In one specific embodiment of the invention, the radius of curvature for a pin of the size above mentioned was approximately 3/16 of an inch.

Figures 2, 2A:
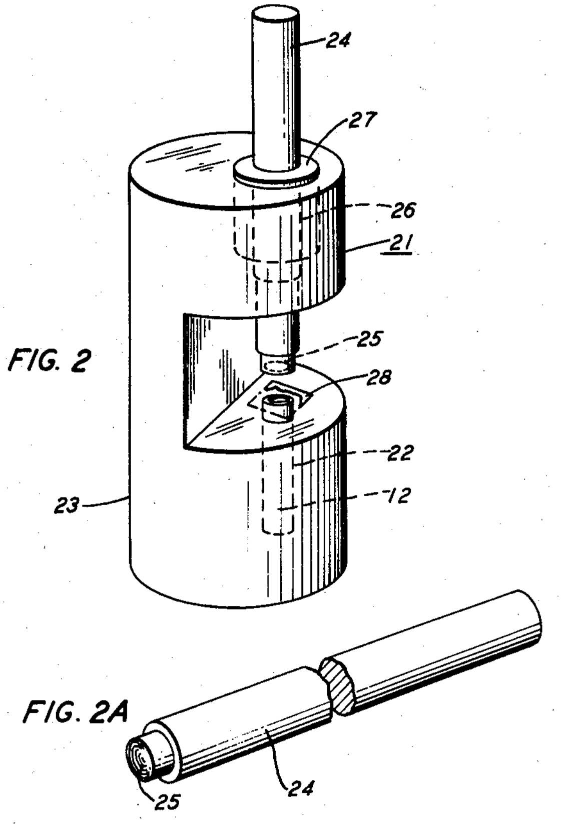
Fig. 2 depicts in perspective a welding jig designed for welding the diaphragm to the pin and for simultaneously forming the curvature of the diaphragm.
Fig. 2A depicts in perspective a welding electrode with a concave tip used to form the curvature of the diaphragm.

Referring to Fig. 2, there is depicted a welding jig 21 designed for welding the diaphragm 14 to the pin 12 and for simultaneously forming the diaphragm curvature. The pin 12 with its bored end upward is placed in a hole 22 in one of the welding electrodes 23. A rod 24 forms the other welding electrode. The rod 24, as depicted also in Fig. 2A, has a concave end portion 25 with a curvature similar to that desired for the diaphragm. The diameter of the rod 24 at the concave end portion 25 is slightly larger than that of the pin 12. The rod 24 is positioned over the pin 12 by a hole 26 in the welding electrode 23. The welding electrode 23 also acts as a supporting structure for the welding electrode 24. The two electrodes, it is noted, are insulated from each other by a Bakelite or similar insulator 27. A piece of foil 28 that is to form the diaphragm 14 is positioned over the pin 12, and the welding electrode 24 with its concave end downward is brought down upon the foil and the pin 12. The two electrodes are attached to a welding machine and the foil 28 is welded to the pin 12. During the welding process, by virtue of both the pressure of the rod 24 upon the foil 28 and the pin 12, and the heat of welding, the foil 28 assumes the curvature of the concave portion 25 of the welding electrode 24. In such a manner the diaphragm 14 is welded to the pin 12 and is automatically given the required amount of curvature.

After welding is completed the excess diaphragm material is removed. A plunger may be used in conjunction with the welding jig for this purpose. The plunger, which may be made of hardened drill rod, is bored in one end with a hole of a diameter slightly greater than that of the pin 12. The welding electrode 24 is removed from the jig and the plunger substituted therefor, with its bored end downward. By driving the plunger downward and over the end of pin 12, the excess diaphragm material is sheared off. If this operation is done immediately after the welding operation, the pin 12 does not have to be removed from the welding jig. Thereafter, the edges of the pin may be polished. Advantageously, both the pin and the diaphragm may be electroplated with gold or a similar material in order to reduce skin effect losses.

Figure 4:
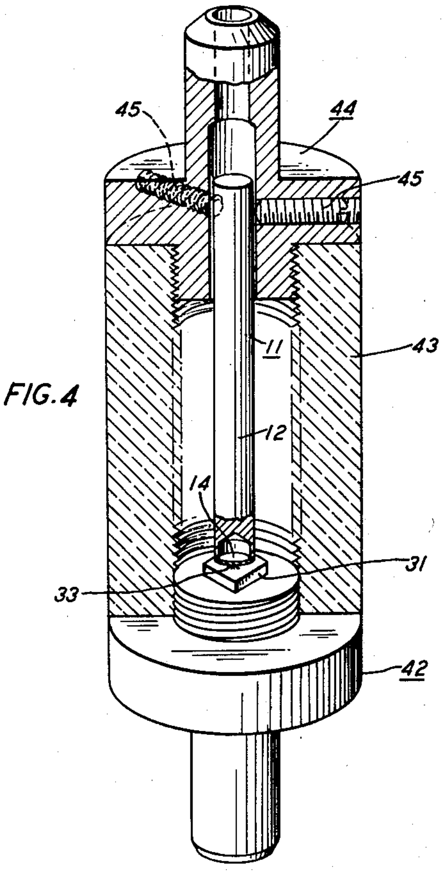
Fig. 4 depicts in perspective and in partial section a diode and its associated contacting element mounted in a supporting structure.
Figure 3:
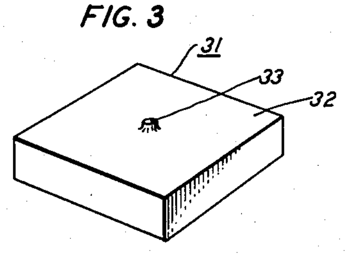
Fig. 3 depicts in perspective a typical diode.

Fig. 3 depicts a typical diode 31, comprising a base portion 32, which may be of silicon or germanium, and a mesa 33. The diode and its mesa contacting element may be assembled together in a compact supporting structure as illustrated in Fig. 4. The diode 31 containing the mesa 33 is soldered or otherwise affixed to a metal stud 42. The stud with the wafer is screwed into one end of an insulating ceramic structure 43, and a metal pin holder 44 is screwed into the other end of the ceramic insulating structure. It is noted that a small amount of polystyrene cement or similar material may be applied to the threads of the stud and the pin holder before these are screwed into the ceramic structure to insure that the threaded joints will remain tight and not loosen.

Next, in assembling a device illustratively embodying the principles of the present invention, the contact element 11 is placed in the pin holder, and is allowed to slide all the way against the mesa. The set screws 45 are then tightened. The unit is now ready for deflection of the diaphragm against the mesa. This may be accomplished by use of a device developed by H. C. Theuerer, which is described on page 326 of "Crystal Rectifiers" by H. C. Torrey and C. A. Whitmer, volume 15 of the Radiation Laboratory Series.

Briefly, then, the deflection instrument comprises a micrometer and a reduction gear box. The micrometer is utilized to drive the pin 12 of the contact element 11, while the purpose of the gear box is to obtain a fine motion of the pin 12, so that the deflection of the dished diaphragm 14 can be closely controlled. The point of final deflection of the diaphragm may be determined by the use of an oscilloscope presentation of current-voltage characteristics. More specifically, electrical connections are made to the diode and an oscilloscope, and the oscilloscope monitors the instant that contact is made with the mesa. After such a contact, and after the electrical characteristics of the diode are determined to be as required, the diaphragm of the contact element may be deflected against the mesa. Final deflection of the diaphragm is undertaken so as to assure that the diaphragm is resiliently biased against the mesa in order to provide a spring-type contact. After final deflection has been achieved, and while the unit is still under the pressure of the deflection instrument, the set screws 45 may be given their final tightening.

Electrical connections may then be made to the assembled diode unit by contacting the pin holder and the stud respectively.

It is to be understood that the above-described embodiment is merely illustrative of the applications of the principles of the present invention. Other arrangements may be easily made by those skilled in the art without departing from the spirit and scope of this invention.

What is claimed is:

1. A semiconductor translating device comprising a semiconductive wafer, said wafer having a raised portion of reduced area on one face thereof, a contact member for contacting the surface of said raised portion, said contact member comprising a rod having a hollowed out portion at one end adjacent said wafer and a dished metal diaphragm affixed to said hollowed out end, and mounting means for supporting said wafer and said contact member.

2. A semiconductor translating device comprising a semiconductive wafer having a raised portion thereon, a contact member for contacting the surface of said raised portion, said contact member comprising a rod and a diaphragm affixed to one end of said rod, said diaphragm having a convex outward shape with respect to the rod end to which it is attached and being that portion of said contact member adjacent said raised portion, and mounting means for supporting said wafer and said member in contacting relationship.

3. A semiconductor translating device in accordance with claim 2 wherein said contact member is coated with a conducting material of greater conductivity than the diaphragm material and the rod material.

4. A semiconductive translating device comprising a semiconductive wafer, a contact member for contacting the surface of said wafer, said contact member comprising a rod and a diaphragm affixed to one end of said rod, said diaphragm having a convex outward shape with respect to the rod end to which it is attached and being that portion of said contact member adjacent said surface, and mounting means for supporting said wafer and said member in contacting relation.

References Cited in the file of this patent

UNITED STATES PATENTS

| | | |
|---|---|---|
| 2,569,570 | Matare et al. | Oct. 2, 1951 |
| 2,728,881 | Jacobi | Dec. 27, 1955 |